US005726863A

United States Patent [19]
Nakayama et al.

[11] Patent Number: 5,726,863
[45] Date of Patent: Mar. 10, 1998

[54] MULTILAYER PRINTED CIRCUIT BOARD

[75] Inventors: Kouji Nakayama, Minamiashigara; Tsutomu Imai, Hadano, both of Japan

[73] Assignee: Hitachi, Ltd., Tokyo, Japan

[21] Appl. No.: 591,687

[22] Filed: Jan. 25, 1996

[30] Foreign Application Priority Data

Jan. 27, 1995 [JP] Japan .................................. 7-011792

[51] Int. Cl.⁶ ...................................................... H05K 3/46
[52] U.S. Cl. ........................... 361/794; 361/792; 361/780; 174/255; 174/262; 174/266
[58] Field of Search ........................... 361/777, 780, 361/792, 794; 174/255, 261, 262, 265, 266; 333/246, 247

[56] References Cited

U.S. PATENT DOCUMENTS 4,984,132 1/1991 Sakurai et al. ......................... 361/794

FOREIGN PATENT DOCUMENTS 2-56998 2/1990 Japan .

Primary Examiner—Leo P. Picard
Assistant Examiner—John B. Vigushin
Attorney, Agent, or Firm—Fay, Sharpe, Beall, Fagan, Minnich & McKee

[57] ABSTRACT

A high-density multilayer printed circuit board is provided such that crosstalk noise between through holes is avoided and wiring efficiency is increased. Power supply through holes which connect to power supply pins of component parts are combined to make room for via holes in certain portions of the multilayer printed circuit board. These power supply through holes are subsequently restored into their original form. This permits via holes to exist at certain locations so that certain wiring layers can be interconnected. Additionally, by restoring the power supply through holes, crosstalk noise is reduced as the rear side of the multilayer printed circuit board is approached. Finally, dummy power supply lines can be provided to further reduce crosstalk noise. These dummy power supply lines are not connected to power supply pins of the component parts.

15 Claims, 4 Drawing Sheets

MULTILAYER PRINTED CIRCUIT BOARD

FIELD OF THE INVENTION

The present invention relates to a multilayer printed circuit board on which pins of component parts are connected according to patterns of wiring layers of the multilayer circuit board. Specifically, the present invention relates to a multilayer printed circuit board used as a high density printed circuit board for use in computers which demand high speed transmission of signals.

BACKGROUND OF THE INVENTION

It is known in the prior art to form a multilayer printed circuit board so that pins of target component parts are connected by standardizing the direction of patterns of wiring layers. This improves wiring efficiency and automation. This way, the plurality of wiring layers may be connected as needed through via holes.

An example of a multilayer printed circuit board according to the prior art is shown in FIG. 3. In FIG. 3, reference numeral 1 and 4 represent through holes, reference numerals 2 and 3 represent via holes, reference numeral 5 represents a wiring pattern in the X direction, and reference numeral 6 represents a wiring pattern in the Y direction. Through holes 1 and 4 permit pins of component parts mounted on the surface of a substrate to wiring patterns 5 and 6. In this example, wiring pattern 5 and wiring pattern 6 are formed in different layers and connected to one another by via holes 2 and 3.

In general, printed circuit board's are formed from a plurality of stacked copper-lined substrates on which patterns are formed. These stacked substrates are perforated and then provided with through holes in order to permit connection with the pins of component parts positioned on the surface with the wiring patterns of the internal layers. However, the through holes for connecting the pins of the component parts and the wiring patterns are formed so as to pass through the stacked substrates and thus interfere with the formation of via holes in those positions in all of the layers. With the increase in the density of pins of component parts, the number of empty areas for forming the via holes are insufficient to properly connect respective layers of the printed circuit board. As a result, wiring efficiency greatly deteriorates. Thus, the number of wiring layers must be increased which also increases the cost of the circuit board.

Another example of a known method of forming a multilayer printed circuit board is disclosed in Japanese Patent Laid-Open No. 2-56998(1990). This example relates to a multilayer printed circuit board using ceramic materials. Such a circuit board is generally formed according to the following process. First, an insulation powder, such as alumina and others, is kneaded with a binder. The resulting paste is extended into a sheet referred to as a green sheet. The green sheet is then perforated and the holes that result are filled with a conductive paste in order to form through holes. Patterns are printed to make boards for each of the wiring layers. The required number of boards is stacked and then sintered.

In the examples shown in FIGS. 2(a) and 2(b), a multilayer printed circuit board using ceramic materials is shown. In these figures, reference letters a, b and c represent through holes and reference letters d and e represent via holes. Finally, reference letters f, g, h and i represent wiring patterns. Once the separate wiring layers are formed as shown in FIG. 2(a), then the various layers can be stacked and sintered to obtain the multilayer printed circuit board as shown in FIG. 2(b).

With the multilayer printed circuit board formed in this manner, through holes can be formed to a desired depth so as to only reach a layer which contains a wiring pattern. This enables the positioning of via holes in certain locations located away from the surface of the multilayer printed circuit board. In other words, the rear side of the printed circuit board is provided with usable lattices for forming via holes in order to connect wiring layers.

However, the present inventors have discovered some problems with the above-mentioned prior art methods and structures and have arrived at the present invention which will be discussed herein.

SUMMARY OF THE INVENTION

A problem with the prior art methods are that even when usable lattices are provided, they are provided in layers below a wiring layer. As such, wiring layers close to the surface layer are not surrounded by a sufficient number of usable lattices to form via holes which may be needed. As a result, the wiring efficiency of the entire multilayer printed circuit board is not as good as it could be if the wiring efficiency in the layers closer to the connecting pins was increased.

Furthermore, as the density of through holes increases, and the transmission speed of signals is also increased, crosstalk noise between the through holes becomes an issue. Thus, it is necessary to form power supply through holes around the through holes which transmit signals. As a result, the number of usable lattices is further reduced due to the presence of power supply through holes. Thus the number of available positions in order to form via holes is further reduced thus reducing the overall wiring efficiency.

In order to overcome the above-mentioned problems, an object of the present invention is to provide a multilayer printed circuit board for mounting component parts having a high pin density with improved wiring efficiency and without increasing crosstalk noise between through holes.

This object is attained by reducing the number of power supply through holes provided near the surface of the multilayer printed circuit board. Once again, the surface as referred to herein corresponds to the layer on which the component parts are mounted. Also, the number of power supply through holes further away from the surface layer is increased.

More specifically, the above-described object of the present invention can be accomplished by concentrating two or more power supply through holes into a single concentrated power supply through hole in order to free-up some room for a via hole at a position where one of the power supply through holes would have been present if not concentrated in this manner. Subsequently, the concentrated power supply through hole can once again be restored into more than one power supply through hole after the required number of layers for a via hole have been provided. This way, additional power supply through holes can be provided to reduce crosstalk noise in subsequent layers.

An advantageous effect may be realized by employing this method because crosstalk noise is relatively small near the surface of the multilayer printed circuit board. This is because the length of the through holes for connecting the patterns of wiring layers near the surface layer as well as the pins of the component parts is short. Thus, crosstalk is not a major issue and fewer power supply lines are needed. In summary, wiring efficiency is increased by reducing the number of power supply through holes passing through wiring layers near the surface while at the same time preventing an unacceptable increase in crosstalk noise.

Also, since crosstalk noise increases in layers further away from the surface, it is advantageous to once again increase the number of power supply through holes that exist in these layers.

Additionally, in order to further reduce crosstalk noise between signal through holes, dummy power supply lines can be provided. Such power supply lines do not actually supply any power to components mounted on the printed circuit board but merely serve to reduce crosstalk. Of course, such dummy power supply lines would be more useful at the rear side of the multilayer printed circuit board.

These and other objects, features and advantages of the present invention will become more apparent in view of the following detailed description of the preferred embodiments.

DETAILED DESCRIPTION OF THE PREFERRED EMBODIMENTS

Figure 1:
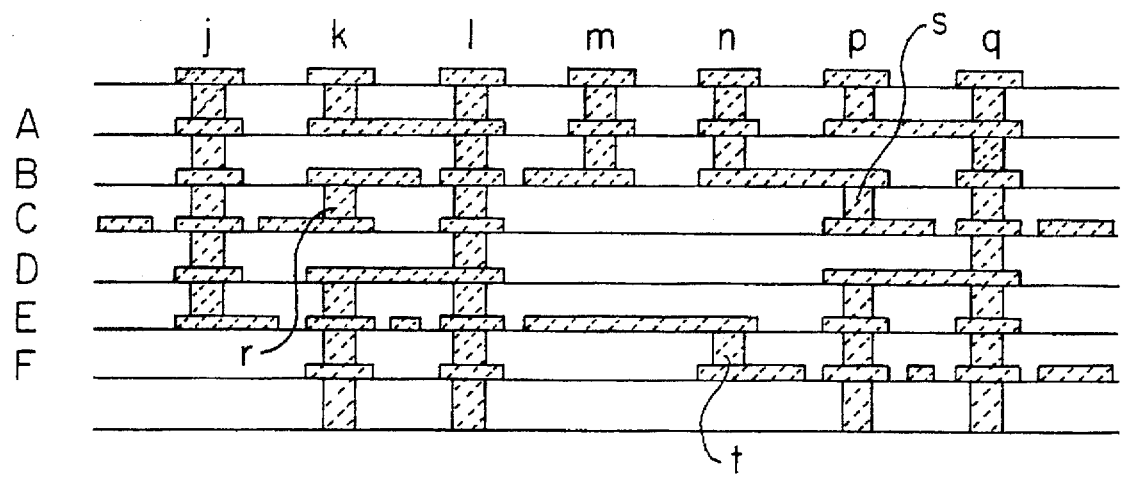
FIG. 1 is a cross-sectional view of the multilayer printed circuit board according to an embodiment of the present invention.
Figure 2A:
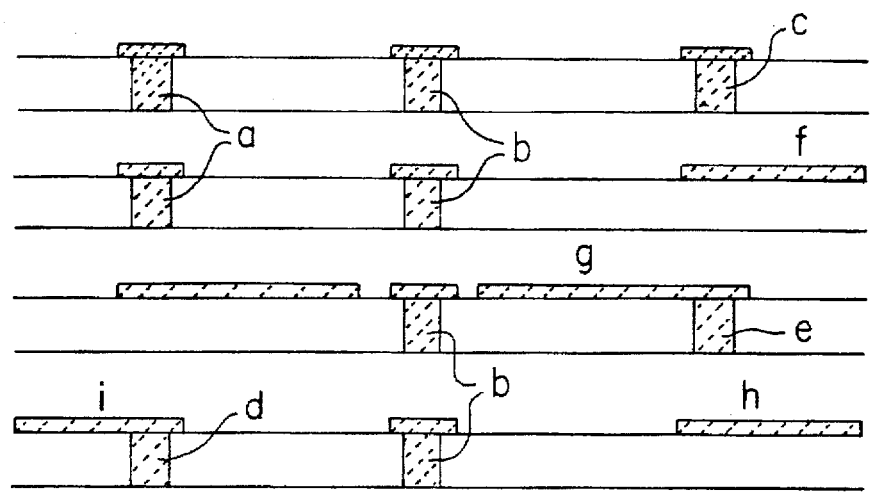
FIGS. 2(a) and 2(b) illustrate a method of manufacturing a multilayer printed circuit board using ceramic material.
Figure 2B:
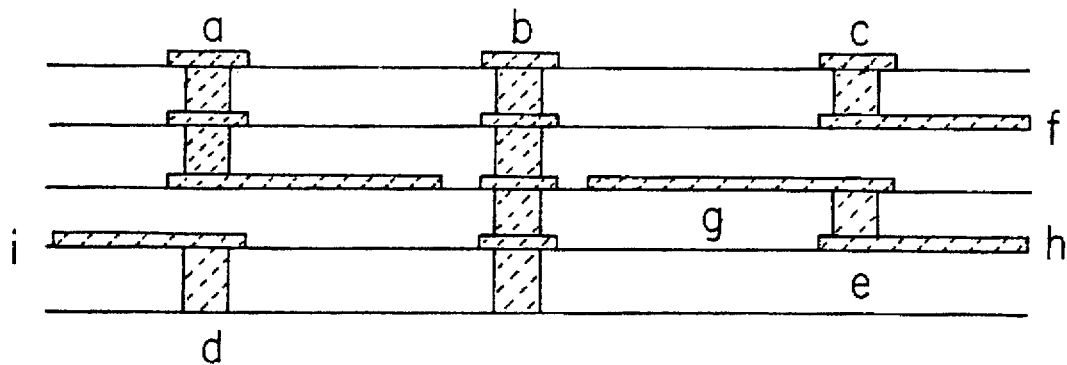
Figure 3:
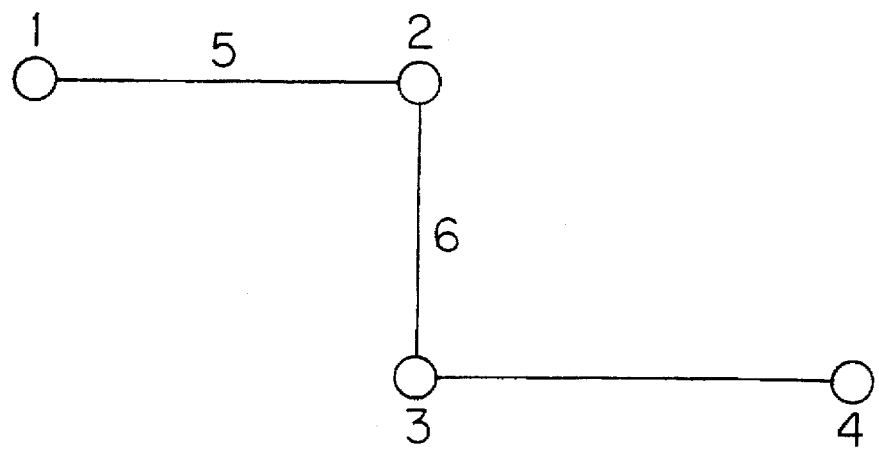
FIG. 3 is a schematic diagram showing various aspects of a multilayer printed circuit board according to the prior art.

An example of a multilayer printed circuit board according to one embodiment of the present invention is shown in FIG. 1. In FIG. 1, reference letters j, m and n represent through holes which are to be connected to signal pins of component parts. Reference letters k, l, p and q are through holes which are to be connected to the power supply pins of the component parts. Reference letters r, s and t represent via holes which connect wiring layers B, C, E and F. Power supply layers are represented by reference letters A and D. As shown in FIG. 1, the multilayer printed circuit board is formed by stacking power supply layers and wiring layers in a desired fashion. In order to free-up room for via hole r to connect wiring layers B and C, power supply through hole k is combined with power supply through hole l at power supply layer A. Then, at power supply layer D, power supply through holes k and l are once again restored as separate through holes. Similarly, in order to provide room for via hole s between wiring layers B and C, power supply through hole p is combined with power supply through hole q at power supply layer A. Then, power supply through holes p and q are once again restored into two separate through holes at power supply layer D. In short, the number of power supply through holes passing through wiring layers B and C is reduced thereby permitting signal through holes m and n to be connected through wiring layers B and C using via holes r and s. This way, through holes m and n do not have to extend through as many layers, thus freeing up usable lattices in subsequent layers.

In order to take advantage of this added wiring efficiency, a via hole t is formed in order to connect wiring layers E and F. This is made possible by the usable lattices freed up below through holes m and n. Additionally, crosstalk noise is reduced because the number of power supply through holes at wiring layers e and f has been increased due to the restoration of the original power supply through holes. Thus, signal through hole j can be properly wired using via hole t.

By employing the method according to the embodiment of the present invention disclosed above, wiring efficiency can be improved by 25% under the following assumptions. It is first assumed that the ratio of the number of signal pins to the total number of pins is 0.45. It is also assumed that the component part mounting pitch is 1.25 times the size of the component part. Given this, the present invention yields a percentage of usable lattices below component parts of approximately 27.5% versus 0% in the prior art. Thus, the wiring length per wiring layer is increased by 25% if power supply through holes are concentrated into one through hole.

While the embodiment of FIG. 1 shows two power supply through holes concentrated into one power supply through hole, it should be understood that more than two power supply through holes can be combined into one power supply through hole. Then, these through holes can be restored to their original number or fewer depending upon the needs of the multilayer printed circuit board. Separation of the concentrated power supply through holes can be done in a step-wise fashion using a number of different power supply layers.

Figure 4:
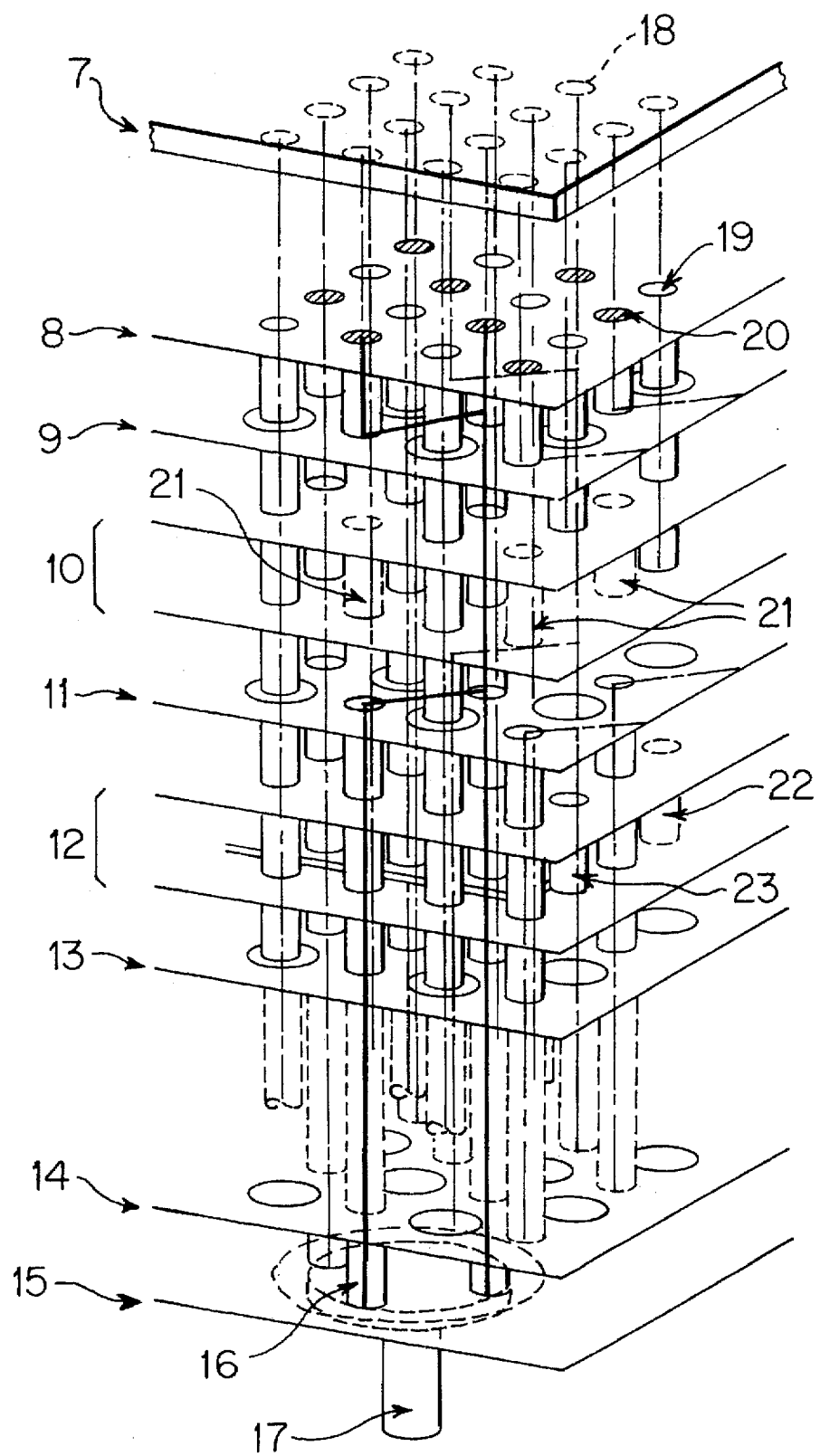
FIG. 4 is a three-dimensional perspective view of a multilayer printed circuit board according to an embodiment of the present invention.

Another embodiment of the present invention is shown in FIG. 4. Although this embodiment is very similar to the previously-disclosed embodiment, it includes a component part 7 having connection pins 18. Also, the rear side of the multilayer printed circuit board is illustrated in more detail by including a power supply through hole 16 which is connected to input/output (I/O) pin 17, which in turn is connected to a power source (not shown). The surface 8 of the substrate is provided with signal through holes 19 and power supply through holes 20. The substrate is provided with a plurality of power supply layers 9, 11, 13 and 14. First and second pairs of wiring layers are represented by reference numerals 10 and 12. First and second pairs of wiring layers 10 and 12 may contain predefined empty areas shown by reference numerals 21 and 22. A via hole 23 is provided to connect the second pair of wiring layers 12. As shown in FIG. 4, a via hole could have been provided in any of the empty portions labeled 21 in the first pair of wiring layers 10. Specifically, one of the predefined empty areas was created by combining two of the power supply through holes of surface 8 into one power supply through hole at power supply layer 9. The two power supply through holes are once again restored at power supply layer 11.

Figure 5:
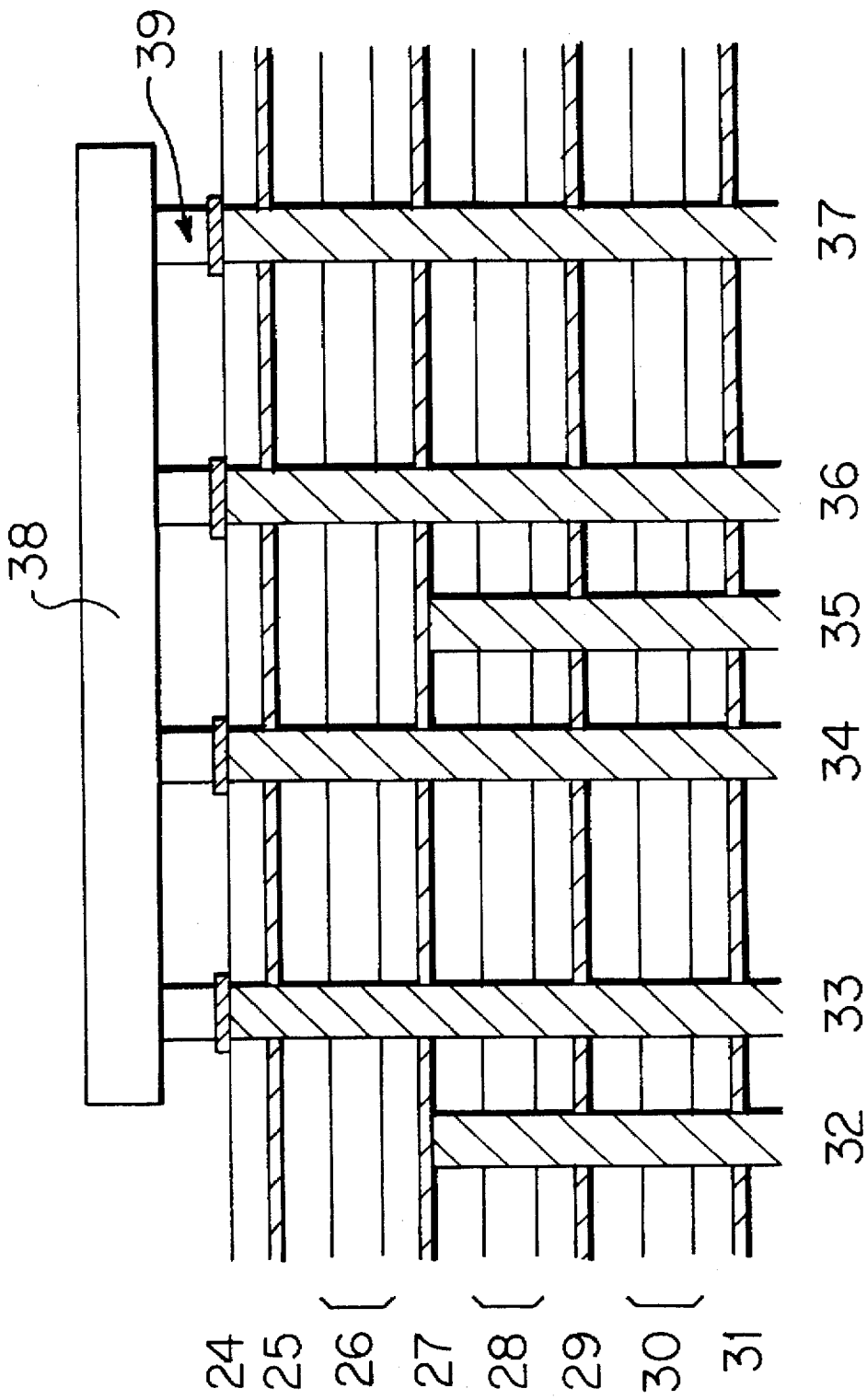
FIG. 5 is a cross-sectional view of a multilayer printed circuit board according to an embodiment of the present invention.

Another embodiment of the present invention is shown in FIG. 5. In this figure, a component 38 is provided with a plurality of pins 39. Each of the pins shown in this figure connect to one of the power supply through holes 33, 34, 36 and 37. Additionally, dummy power supply through holes 32 and 35 are provided to reduce crosstalk noise but are not connected to any component parts. Dummy power supply line 35 is provided under component 38 to reduce crosstalk between signal lines extending from component 38. On the other hand, dummy power supply through hole 32 is provided outside the area below component 38 and is used to reduce crosstalk between signal lines of adjacent components. Dummy power supply through holes 32 and 35 are provided for layers further away from the component 38, where crosstalk is a bigger problem. In this figure, a plurality of power supply layers 25, 27, 29 and 31, a plurality of pairs of wiring layers 26, 28 and 30, and a surface 24 are shown.

While the present invention has been disclosed above with respect to the preferred embodiments, one of ordinary skill in the art would be enabled by this disclosure to make various modifications to these embodiments and still be within the scope and spirit of the present invention as recited in the appended claims.

We claim:

1. A multilayer printed circuit board having a surface onto which a component part is mounted, the component part having signal pins and power supply pins, the multilayer printed circuit board comprising:

a plurality of wiring layers;

a plurality of power supply layers;

a first set of through holes extending from a surface of the multilayer printed circuit board for connecting to the signal pins of the component part;

a second set of through holes extending from the surface of the multilayer printed circuit board for connecting to the power supply pins of the component parts;

wherein one or more through holes of said second set of through holes is combined with another through hole of said second set of through holes in order to produce a concentrated through hole, said concentrated through hole extending through a predetermined number of wiring layers of said plurality of wiring layers before being divided into two separate through holes, thereby defining a portion through which no through holes extend for the predetermined number of layers; and wherein a via hole is provided in the portion where no through hole exists in order to connect at least two wiring layers of the plurality of wiring layers.

2. A multilayer printed circuit board according to claim 1, further comprising a first dummy power supply through hole provided beneath the component but not connected to any of the power supply pins.

3. A multilayer printed circuit board according to claim 2, further comprising a second dummy power supply through hole provided below the surface, but not beneath the component, and also not being connected with any of the power supply pins, the first and second dummy power supply through holes being provided to reduce crosstalk noise.

4. A multilayer printed circuit board according to claim 1, further comprising a dummy power supply through hole provided below the surface but not beneath the component and not connected with any of the power supply pins.

5. A multilayer printed circuit board having a plurality of wiring layers and power supply layers, the multilayer printed circuit board comprising:

a plurality of through holes extending through the printed circuit board, wherein at least one of the plurality of through holes is combined with another through hole of the plurality of through holes for a predetermined number of layers to form a combined through hole so as to leave an area below said one of the plurality of through holes for a via hole;

a via hole being provided in said area;

wherein said plurality of through holes are power supply through holes and said via hole is used to connect two of said plurality of wiring layers; and wherein after said predetermined number of layers, said combined through hole is divided into two separate through holes in order to decrease crosstalk noise.

6. A multilayer printed circuit board according to claim 5, wherein the multilayer printed circuit board has a surface and a layer of said predetermined number of layers that is closest to said surface is also a closest one of the plurality of wiring layers to said surface.

7. A multilayer printed circuit board according to claim 6, further comprising:

component parts mounted on the surface of the multilayer printed circuit board, the component parts including power supply pins; and a dummy power supply through hole provided through certain ones of the plurality of wiring layers and plurality of power supply layers in order to further reduce crosstalk noise, wherein said dummy power supply through hole does not connect to any of the power supply pins of the component parts.

8. A multilayer printed circuit board according to claim 5, further comprising:

component parts mounted on the surface of the multilayer printed circuit board, the component parts including power supply pins; and a dummy power supply through hole provided through certain ones of the plurality of wiring layers and plurality of power supply layers in order to further reduce crosstalk noise, wherein said dummy power supply through hole does not connect to any of the power supply pins of the component parts.

9. A multilayer printed circuit board having a surface and comprising:

a plurality of through holes extending perpendicularly from the surface;

a first set of signal layers;

a second set of signal layers provided further away from the surface than said first set of signal layers; and a first power supply layer provided between said first and second set of signal layers;

wherein a first one of said plurality of through holes is separated into first and second through holes at said first power supply layer, and wherein said first one of said plurality of through holes is formed by combining said first one with a third one of the plurality of through holes at a second power supply layer, the second power supply layer being provided closer to the surface than said first set of signal layers; and further comprising a via hole existing in said first set of signal layers, wherein said via hole and said plurality of through holes each have a central axis and wherein an imaginary line drawn perpendicular to the surface which coincides with the central axis of said third one of the plurality of through holes also coincides with the central axis of said via hole.

10. A multilayer printed circuit board according to claim 9 wherein said imaginary line also coincides with the central axis of said second one of the plurality of through holes.

11. A multilayer printed circuit board according to claim 10, wherein the plurality of through holes are power supply through holes.

12. A multilayer printed circuit board according to claim 11, further comprising:

a component mounted on the surface, the component having a plurality of power supply pins; and a first dummy power supply through hole provided beneath the component but not connected to any of the plurality of power supply pins.

13. A multilayer printed circuit board according to claim 12, further comprising a second dummy power supply through hole provided below the surface, but not beneath the component, and also not being connected with any of the plurality of power supply pins, the first and second dummy power supply through holes being provided to reduce crosstalk noise.

14. A multilayer printed circuit board according to claim 13, wherein a first number of the power supply through holes pass through said first set of signal layers and a second number of the power supply through holes pass through said second set of signal layers, and wherein said first number is less than said second number.

15. A multilayer printed circuit board according to claim 11, wherein a first number of power supply through holes pass through said first set of signal layers and a second number of power supply through holes pass through said second set of signal layers, and wherein said first number is less than said second number.

* * * * *